(12) United States Patent
Nickel et al.

(10) Patent No.: US 7,613,040 B1
(45) Date of Patent: Nov. 3, 2009

(54) METHODS FOR USING SENSE LINES TO THERMALLY CONTROL THE STATE OF AN MRAM

(75) Inventors: Janice H. Nickel, Sunnyvale, CA (US); Manuj Bhattacharyya, Cupertino, CA (US); Robert G. Walmsley, Palo Alto, CA (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/133,930

(22) Filed: Jun. 5, 2008

Related U.S. Application Data

(62) Division of application No. 10/733,089, filed on Dec. 11, 2003, now Pat. No. 7,397,098.

(51) Int. Cl.
*G11C 11/14* (2006.01)

(52) U.S. Cl. ...................................................... 365/173

(58) Field of Classification Search .................. 257/421; 365/158, 171, 173
See application file for complete search history.

(56) References Cited

U.S. PATENT DOCUMENTS

| 6,130,835 | A | 10/2000 | Scheuerlein |
| 2001/0021124 | A1* | 9/2001 | Odagawa et al. ............ 365/158 |
| 2004/0125673 | A1 | 7/2004 | Daughton et al. |
| 2005/0104146 | A1 | 5/2005 | Nickel et al. |

* cited by examiner

*Primary Examiner*—Thomas L Dickey
(74) *Attorney, Agent, or Firm*—Myers Bigel Sibley & Sajovec, P.A.

(57) ABSTRACT

A method of switching a magnetic orientation of at least one of a plurality of magnetic memory elements in a magnetic random access device can include coupling a sense line to the at least one of the plurality of magnetic memory elements wherein the sense line includes a first via and a second via and utilizing the sense line to thermally assist in switching a magnetic orientation of at least one of the plurality of magnetic memory elements.

10 Claims, 4 Drawing Sheets

COUPLING A SENSE LINE TO THE AT LEAST ONE OF THE PLURALITY OF MAGNETIC MEMORY ELEMENTS WHEREIN THE SENSE LINE INCLUDES A FIRST VIA AND A SECOND VIA
210

UTILIZING THE SENSE LINE TO THERMALLY ASSIST IN SWITCHING A MAGNETIC ORIENTATION OF AT LEAST ONE OF THE PLURALITY OF MAGNETIC MEMORY ELEMENTS
220

METHODS FOR USING SENSE LINES TO THERMALLY CONTROL THE STATE OF AN MRAM

CLAIM OF PRIORITY

This application is a Divisional of, and claims priority to U.S. patent application Ser. No. 10/733,089, filed on Dec. 11, 2003, now U.S. Pat. No. 7,397,098 the disclosure of which is incorporated herein by reference in its entirety.

FIELD OF THE INVENTION

The present invention relates generally to magnetic random access memory devices and more particularly to a magnetic random access memory device and a method of switching the magnetic orientation of memory elements therein.

BACKGROUND

Consider the example of an MRAM device including a resistive cross point array of spin dependent tunneling (SDT) junctions, word lines extending along rows of the SDT junctions, and bit lines extending along columns of the SDT junctions. Each SDT junction is located at a cross point of a word line and a bit line. The magnetization of each SDT junction assumes one of two stable orientations at any given time. These two stable orientations, parallel and anti-parallel, represent logic values of '0' and '1'. The magnetization orientation, in turn, affects the resistance of the SDT junction. Resistance of the SDT junction is a first value (R) if the magnetization orientation is parallel and a second value (R+ΔR) if the magnetization orientation is anti-parallel.

The magnetization orientation of the SDT junction and, therefore, its logic value may be read by sensing its resistance state. This is conventionally accomplished by sensing the resistance of the bit through the word and bit lines, which, in a resistive cross point array, act as write conductors during write operations, and sense lines during read operations. An alternate configuration utilizes a dedicated sense line in addition to the word and bit lines. FIG. 1 shows an MRAM structure 100 in conjunction with the alternate configuration. The configuration 100 includes write conductors 110, SDT junctions 120, a sense line 130 with a single sense via 140 and a voltage source 150.

A write operation on a selected SDT junction is performed by supplying write currents to the word and bit lines crossing the selected SDT junction. The currents create two external magnetic fields that, when combined, switch the magnetization orientation of the selected SDT junction from parallel to anti-parallel or vice versa. However, too small a write current might not cause the selected SDT junction to change its magnetization orientation thereby resulting in the occurrence of half-select errors.

Conventional MRAM designs sometimes need two current driven magnetic fields to effectively switch the magnetization orientation and avoid half-select errors. However, the magnitude of the current(s) needed to switch the magnetization orientation of the SDT junction during a write operation should be as small as possible in order maintain the cost advantage of the implementation of the MRAM device.

Accordingly, what is needed is an MRAM device and a method of switching a magnetic orientation of memory elements therein that reduces the current required to switch the magnetic orientation of the magnetic tunnel junction. The device and method should be simple, inexpensive and capable of being easily adapted to existing technology. The present invention addresses this need.

SUMMARY

Embodiments according to the invention can provide methods and systems for using sense lines to thermally control the state of an MRAM. Pursuant to these embodiments, a method of switching a magnetic orientation of at least one of a plurality of magnetic memory elements in a magnetic random access device can include coupling a sense line to the at least one of the plurality of magnetic memory elements wherein the sense line includes a first via and a second via and utilizing the sense line to thermally assist in switching a magnetic orientation of at least one of the plurality of magnetic memory elements.

Other aspects and advantages of the present invention will become apparent from the following detailed description, taken in conjunction with the accompanying drawings, illustrating by way of example the principles of the invention.

BRIEF DESCRIPTION OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

DETAILED DESCRIPTION

Figures 1, 2:
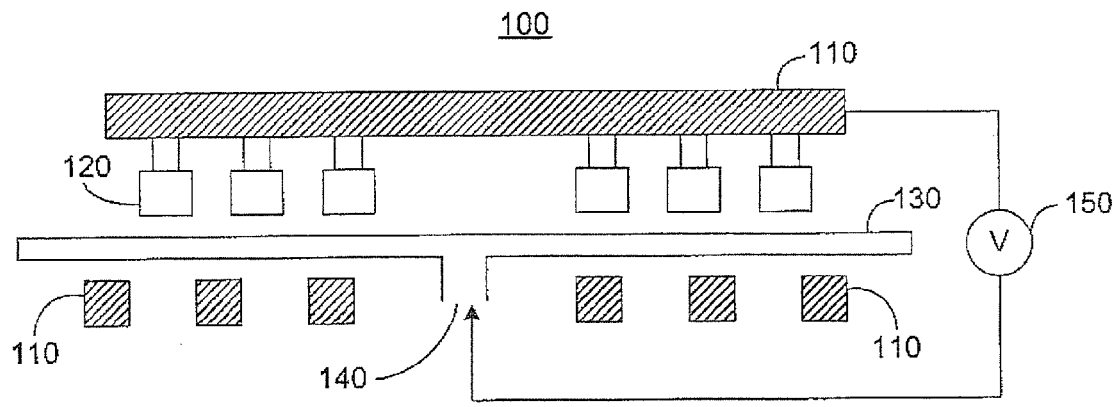
FIG. 1 shows a conventional MRAM structure.
FIG. 2 is a high-level flow chart of a method in accordance with an embodiment of the present invention.

The present invention includes a magnetic random access memory (MRAM) device and a method of switching the magnetic orientation of memory elements therein. The following description is presented to enable one of ordinary skill in the art to make and use the invention and is provided in the context of a patent application and its requirements. Various modifications to the embodiments and the generic principles and features described herein will be readily apparent to those skilled in the art. Thus, the present invention is not intended to be limited to the embodiment shown but is to be accorded the widest scope consistent with the principles and features described herein.

As shown in the drawings for purposes of illustration, an MRAM device and a method of switching the magnetic orientation of memory elements therein is disclosed. Accordingly, a sense line is utilized to thermally assist in the switching of the magnetic orientation of magnetic memory elements within the MRAM device. By utilizing the sense line to thermally assist in the switching of the magnetic orientation of magnetic memory elements within the MRAM device, the write current needed to perform the write operations of the MRAM device is substantially reduced.

FIG. 2 is a high level flow chart of a method of switching the magnetic orientation of memory elements in an MRAM device. A first step 210 includes coupling a sense line to the at least one of the plurality of magnetic memory elements wherein the sense line includes a first via and a second via. A second step 220 involves utilizing the sense line to thermally assist in switching a magnetic orientation of at least one of the plurality of magnetic memory elements.

As shown in the drawings for purposes of illustration, an MRAM device is disclosed that includes an array of magnetic memory elements. A magnetic memory element of the MRAM device can be any element having a resistance that is dependent upon the state of its magnetic film. Examples of such elements include magnetic tunnel junctions (the SDT junction is a type of magnetic tunnel junction) and giant magnetoresistance ("GMR") spin valves. For the purposes of illustration the memory elements are described below as SDT junctions.

Figure 3:
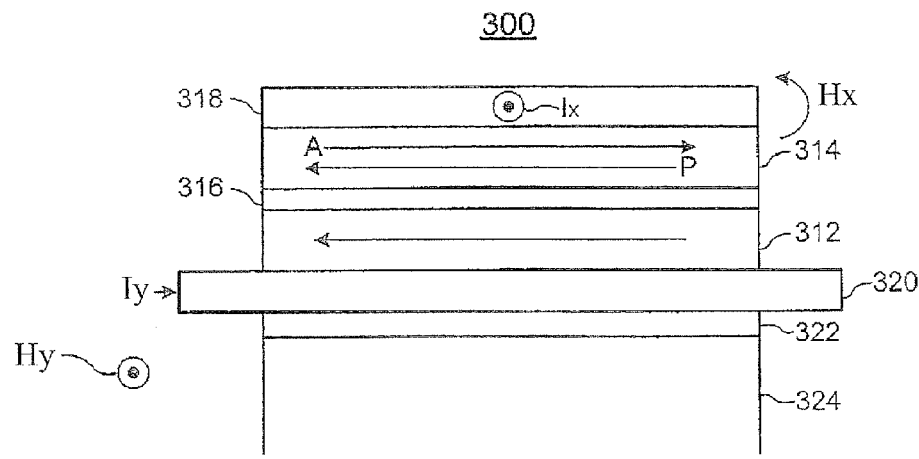
FIG. 3 shows an SDT junction in accordance with an embodiment of the present invention.

FIG. 3 shows an exemplary SDT junction 300 on a substrate 324. The SDT junction 300 includes a pinned layer 312 having a magnetization that is oriented in the plane of the pinned layer 312 but fixed by an antiferromagnetic pinning layer (not shown) so as not to rotate in the presence of an applied magnetic field in a range of interest. In an alternate embodiment, the pinned layer 312 is a synthetic ferromagnet pinned by an antiferromagnetic pinning layer.

The SDT junction 300 also includes a "free" layer 314 having a magnetization orientation that is not pinned. Rather, the magnetization can be oriented in either of two directions along an axis (the "easy" axis) lying in the plane of the free layer 314. If the magnetization of the pinned and free layers 312 and 314 are in the same direction, the orientation is said to be "parallel" (as indicated by the arrow P). If the magnetization of the pinned and free layers 312 and 314 are in opposite directions, the orientation is said to be "anti-parallel" (as indicated by the arrow A).

The pinned layer 312 and the free layer 314 are separated by an insulating tunnel barrier 316. The insulating tunnel barrier 316 allows quantum mechanical tunneling to occur between the pinned layer 312 and the free layer 314. This tunneling phenomenon is electron spin dependent, making the resistance of the SDT junction 300 a function of the relative orientations of the magnetization of the pinned layer 312 and the free layer 314. In this embodiment, the free layer 314 is deposited on top of the tunnel barrier 316. However, the free layer 314 may also be deposited below the tunnel barrier 316, with the pinned layer 312 deposited on top of the tunnel barrier 316 (so called "top pinned" structure).

The junction 300 also includes a sense line 320 for sensing the resistance state of the SDT junction 300 during a read operation. Resistance of the SDT junction 300 is a function of the relative orientations of the magnetization of the pinned layer 312 and the free layer 314. For instance, resistance of the SDT junction 300 is a first value (R) if the magnetization orientation of the pinned layer 312 and the free layer 314 is anti-parallel and a second value (R+ΔR) if the magnetization orientation is parallel.

Magnetic fields ($H_x$, $H_y$) may be applied to the SDT junction 300 by supplying currents ($I_x$, $I_y$) to first and second conductors 318 and 322. In an embodiment, one of the conductors 318, 322 contacts the SDT junction and also serves as the second sense line. If the conductors 318 and 322 are orthogonal, the applied magnetic fields ($H_x$, $H_y$) will also be orthogonal.

When sufficiently large currents ($I_x$, $I_y$) are passed through the conductors 318 and 322 (e.g. during a write operation), the combined magnetic field ($H_x+H_y$) in the vicinity of the free layer 314 causes the magnetization of the free layer 314 to rotate from the parallel orientation to the anti-parallel orientation, or vice-versa.

Figure 4:
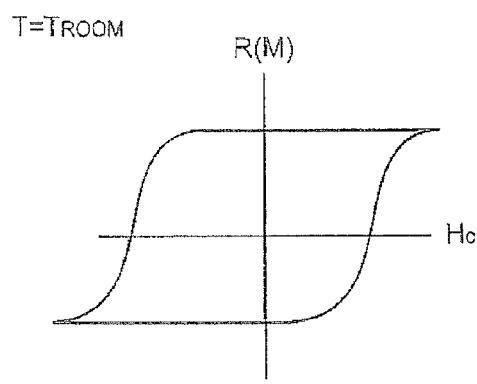
FIG. 4 shows the coercivity ($H_c$) of the SDT junction at room temperature.
Figure 5:
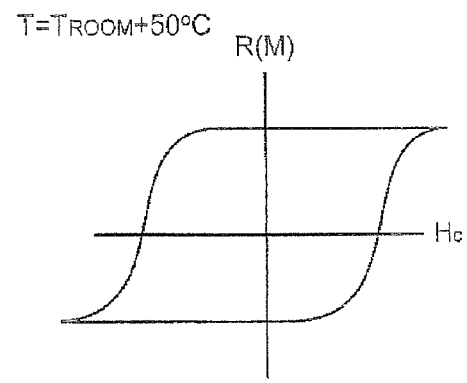
FIG. 5 shows the coercivity ($H_c$) of the SDT junction at 50L above room temperature.

Current magnitudes are selected such that the combined magnetic field ($H_x+H_y$) exceeds the switching field of the free layer 314 but does not exceed the switching field of the pinned layer 312. However, the magnitude of one or both write currents ($I_x$, $I_y$) may be reduced if the SDT junction 300 is heated. Coercivity of a magnetic film decreases with increasing temperature. Raising the temperature of the SDT junction 300 reduces the coercivity ($H_c$) of the SDT junction 300 as shown in FIGS. 4 and 5. FIG. 4 shows the coercivity ($H_c$) at room temperature while FIG. 5 shows the coercivity ($H_c$) at 50☐ above room temperature.

At the elevated temperature, the SDT junction 300 switches from a high resistance state to a low resistance state and vice-versa in the presence of a lower combined magnetic field ($H_x+H_y$). Therefore, heating the SDT junction 300 allows the magnitudes of one or both of the write currents ($I_x$, $I_y$) to be reduced. If, on the other hand, the magnitudes of the write currents ($I_x$, $I_y$) are not reduced, the SDT junction 300 will switch more reliably in the presence of the combined magnetic field ($H_x+H_y$). The temperature and write current can be varied to achieve a desired switching reliability.

Heat may be applied and removed before the combined magnetic field ($H_x+H_y$) is applied, or the heat may be applied at the same time as the combined magnetic field ($H_x+H_y$). The free layer 314 may be heated to about 0☐ to 50☐ above room temperature. More generally, the maximum heating temperature may be about 50☐ less than Blocking temperature $T_B$ (the temperature above which the pinned layer 312 loses its pinning properties). However, one of ordinary skill in the art will readily recognize that the free layer 314 can be heated to any temperature.

Figure 6:
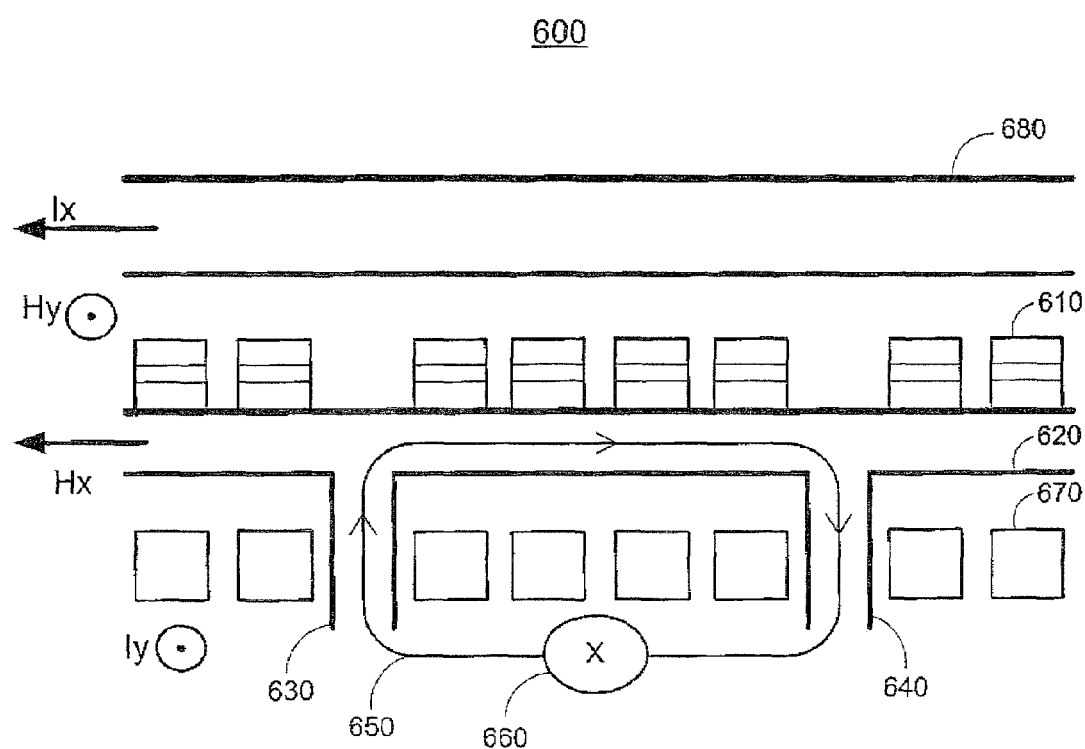
FIG. 6 shows a MRAM structure in accordance with an embodiment of the present invention.

In an embodiment, heat is applied to the SDT junction 300 from the sense line 320. FIG. 6 shows a MRAM structure 600. The MRAM structure 600 includes a plurality of SDTs 610, sense line 620, a first via 630 and a second via 640. The MRAM structure 600 further includes conductors 670 and 680. In an embodiment, the sense line 620 is composed of a material that has a low heat capacity i.e. heats up quickly. Such materials include, but are not limited to, semiconductor materials such as Pt, SiC, amorphous Si, C or the like. The resistive nature of these materials allows heat to be generated therefrom upon the application of a modest current 650 thereto. It should also be noted that although the sense line 620 is made of a resistive material, the thickness of the sense line 620 is such that the resistance thereof is not significant enough to skew the read operations that determine the resistance state of the SDT junctions 610.

The current 650 is generated from a current source 660 coupled to the via 630 and hence coupled to the sense line 620. As the current 650 conducts from the first via 630 to the second via 640, energy from the current 650 is transferred to the SDTs 610 whereby the transferred energy heats up the SDTs 610 thereby lowering the coercivity of the SDTs 610 on the sense line 620. Accordingly, by lowering the coercivity of the SDTs 610, the magnitudes of one or both of the write currents ($I_x$, $I_y$) needed to switch the magnetic orientations thereof is substantially reduced.

Additionally, if the coercivity is such that, even at an elevated temperature, two orthogonal fields are implemented to switch the magnetic orientation of the free layer, then the structure 600 employs two write conductors to provide orthogonal fields wherein one write conductor is thermally isolated from the sense line 620. However, it is conceivable that the coercivity could be reduced to the point whereby only one write conductor is needed to switch a magnetic orientation of each of the plurality of SDTs 610. If this is the case, then the one write conductor is positioned orthogonal to the sense line 620.

Figure 7:
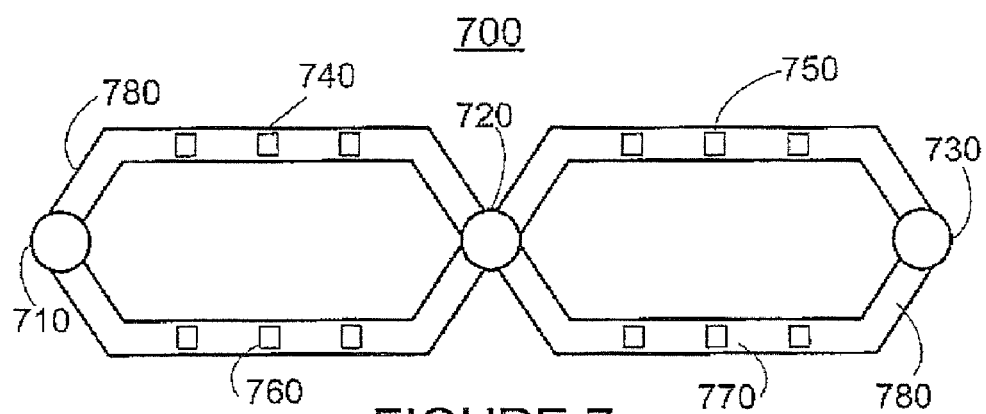
FIG. 7 shows a top view of an alternate configuration in accordance with an embodiment of the present invention.

In an alternate embodiment, a network of vias are utilized to heat the memory elements in a more selective fashion. FIG. 7 shows a top view of one possible alternate configuration 700. The configuration 700 includes a plurality of vias 710, 720, 730 and groups of magnetic tunnel junctions 740, 750, 760 and 770. Although only three SDT's are in each group, however, the configuration can incorporate any number of junctions. The configuration 700 also includes a sense line 780. Accordingly, the sense line 780 is utilized to selectively heat groups of magnetic tunnel junctions 740 and 760 by conducting a current from via 710 to via 720 or junctions 750 and 770 by conducting a current from via 720 to via 730. Consequently, by implementing the network configuration 700, the write selectivity of the MRAM device is substantially improved. Furthermore, this configuration permits parallel selection of devices for writing.

Although the above-described network configuration is disclosed, one of ordinary skill in the art will readily recognize that a variety of different network configurations can be implemented.

Figure 8:
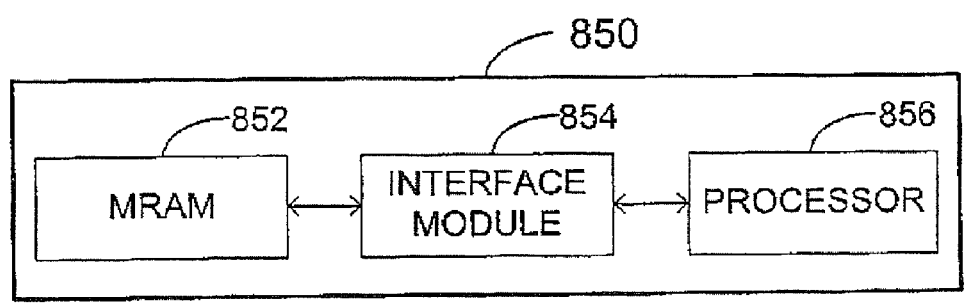
FIG. 8 shows an exemplary general application for an MRAM device in accordance with an embodiment of the present invention.

The MRAM device described herein may be used in a variety of applications. FIG. 8 shows an exemplary general application for an MRAM device. The general application is embodied by a system 850 including an MRAM device 852, an interface module 854 and a processor 856. Interface module 854 provides an interface between processor 856 and MRAM device 852. System 850 could also include other types and/or levels of memory.

For a system 850 such as a notebook computer or personal computer, the interface module 854 might include an IDE or SCSI interface. For a system 850 such as a server, multiple MRAM devices could be implemented and interface module 854 might include a fiber channel or SCSI interface. For a device 850 such as a digital camera, the interface module 854 might include a camera interface. Here, the MRAM device 854 would allow non-volatile storage of digital images onboard the digital camera.

The above embodiments of the MRAM device may offer advantages over other MRAM devices. For example, a higher level of memory cell densities may be achieved compared to other MRAM devices that include additional elements. Increased densities may result in decreased costs for a given amount of storage capacity. In addition the memory cell strings described herein may provide better electrical circuit isolation compared to previous MRAM devices. The improved isolation may allow for more reliable detection of the state of memory cells in a memory cell string.

The MRAM device in accordance with an embodiment may also be used for long-term data storage in a computer. Such a device offers many advantages (e.g. faster speed, smaller size) over hard drives and other conventional long-term data storage devices. Additionally, the MRAM device according to an embodiment can possibly replace DRAM and other fast, short-term memory in computers.

The memory device is not limited to the specific embodiments described and illustrated above. For instance, an MRAM device is not limited to the use of spin dependent tunneling devices. Other types of devices that could be used include, but are not limited to, giant magnetoresistance ("GMR") devices.

Varying embodiments of a magnetic random access memory device and a method of switching the magnetic orientation of magnetic memory elements therein are disclosed. Accordingly, a sense line is utilized to thermally assist in the switching of the magnetic orientation of magnetic memory elements within the MRAM device. By utilizing the sense line to thermally assist in the switching of the magnetic orientation of magnetic memory elements within the MRAM device, the write current needed to perform the write operations of the MRAM device is substantially reduced.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method of switching a magnetic orientation of at least one of a plurality of magnetic memory elements in a magnetic random access device comprising:

coupling a sense line to the at least one of the plurality of magnetic memory elements wherein the sense line includes a first via and a second via; and utilizing the sense line to thermally assist in switching a magnetic orientation of at least one of the plurality of magnetic memory elements, wherein utilizing the sense line to thermally assist in switching a magnetic orientation of at least one of the plurality of magnetic memory elements further comprising: coupling a current source to the sense line; and utilizing the sense line to heat at least one of the plurality of magnetic memory elements; and wherein utilizing the sense line to heat at least one of the plurality of magnetic memory elements further comprises: utilizing the current source to provide a current from the first via to the second via wherein the current heats at least one of the plurality of magnetic memory elements.

2. The method of claim 1 wherein each of the plurality of magnetic memory elements comprises a spin dependent tunneling junction.

3. The method of claim 1 wherein each of the plurality of magnetic memory elements comprises a giant magnetoresistive device.

4. The method of claim 1 wherein the sense line comprises a semiconductor material.

5. The method of claim 4 wherein the semiconductor material comprises at least one of Pt, SiC, Si or C material.

6. The method of claim 1 wherein each of the plurality of magnetic memory elements includes a free layer and switching a magnetic orientation of at least one of the plurality of magnetic memory elements comprises switching a magnetic orientation of the free layer.

7. The method of claim 6 wherein the sense line is above the free layer.

8. The method of claim 6 wherein the sense line is below the free layer.

9. The method of claim 1 wherein each of the plurality of magnetic memory elements further comprises at least one write conductor.

10. The method of claim 9 wherein the at least one write conductor comprises two write conductors wherein the two write conductors are utilized to switch the magnetic orientation of the magnetic memory elements.

* * * * *